US009881846B2

(12) United States Patent
Yamada

(10) Patent No.: US 9,881,846 B2
(45) Date of Patent: Jan. 30, 2018

(54) SEMICONDUCTOR DEVICE

(71) Applicant: FUJI ELECTRIC CO., LTD., Kawasaki-shi, Kanagawa (JP)

(72) Inventor: Takafumi Yamada, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/254,508

(22) Filed: Sep. 1, 2016

(65) Prior Publication Data
US 2017/0117201 A1  Apr. 27, 2017

(30) Foreign Application Priority Data
Oct. 23, 2015 (JP) ................. 2015-209389

(51) Int. Cl.
*H01L 23/22* (2006.01)
*H01L 23/31* (2006.01)
*H01L 23/367* (2006.01)
*H01L 23/538* (2006.01)
*H01L 25/07* (2006.01)
*H01L 27/02* (2006.01)
*H01L 27/06* (2006.01)
*H01L 23/24* (2006.01)
(Continued)

(52) U.S. Cl.
CPC .......... *H01L 23/3121* (2013.01); *H01L 23/24* (2013.01); *H01L 23/3675* (2013.01); *H01L 23/3735* (2013.01); *H01L 23/4334* (2013.01); *H01L 23/488* (2013.01); *H01L 23/5386* (2013.01); *H01L 25/072* (2013.01); *H01L 27/0255* (2013.01); *H01L 27/0647* (2013.01); *H01L 23/36* (2013.01)

(58) Field of Classification Search
CPC . H01L 23/3121; H01L 23/3735; H01L 23/24; H01L 23/3675; H01L 23/488; H01L 23/5386; H01L 25/072; H01L 27/0255; H01L 27/0647
USPC ......................................... 257/687
See application file for complete search history.

(56) References Cited

U.S. PATENT DOCUMENTS 5,956,231 A * 9/1999 Yamada ................ H01L 23/049
257/678
6,201,696 B1 * 3/2001 Shimizu .................. H01L 23/24
165/80.2
(Continued)

FOREIGN PATENT DOCUMENTS

| JP | H05-218454 A | 8/1993 |
|---|---|---|
| JP | 2006-202885 A | 8/2006 |
| JP | 2007-150342 A | 6/2007 |

*Primary Examiner* — Luan C Thai
(74) *Attorney, Agent, or Firm* — Rabin & Berdo, P.C.

(57) ABSTRACT

A semiconductor device includes: a semiconductor element; a laminated substrate including an insulating plate and a circuit board which is arranged on the front surface of the insulating plate and on which the semiconductor element is arranged; a lead terminal provided via solder in a major electrode of the front surface of the semiconductor element; and a sealing resin for sealing the semiconductor element, the laminated substrate, and the lead terminal, wherein a value of "Young's modulus of the sealing resin×(linear expansion coefficient of the lead terminal−linear expansion coefficient of the sealing resin)" is equal to or greater than $-26\times10^3$ (Pa/° C.) and equal to or less than $50\times10^3$ (Pa/° C.).

12 Claims, 12 Drawing Sheets

(51) Int. Cl.
*H01L 23/373* (2006.01)
*H01L 23/433* (2006.01)
*H01L 23/488* (2006.01)
H01L 23/36 (2006.01)

(56) References Cited

U.S. PATENT DOCUMENTS

| | | | | |
|---|---|---|---|---|
| 7,449,726 | B2 * | 11/2008 | Nakanishi | H01L 23/562 257/150 |
| 7,910,952 | B2 * | 3/2011 | Tschirbs | H01L 23/3735 257/177 |
| 8,125,080 | B2 * | 2/2012 | Lee | H01L 23/3121 257/724 |
| 8,441,117 | B2 * | 5/2013 | Soyano | H01L 23/04 257/693 |
| 8,558,367 | B2 * | 10/2013 | Ota | H01L 23/24 257/687 |

* cited by examiner

SEMICONDUCTOR DEVICE

CROSS-REFERENCE TO RELATED APPLICATION

This application is based upon and claims the benefit of priority of the prior Japanese Patent Application No. 2015-209389, filed on Oct. 23, 2015, the entire contents of which are incorporated herein by reference.

BACKGROUND OF THE INVENTION

1. Field of the Invention

Embodiments discussed herein relate to semiconductor devices.

2. Background of the Related Art

A semiconductor device includes a plurality of power semiconductor elements, and is used as a power conversion device or a switching device. For example, a semiconductor device may be obtained by connecting in parallel a semiconductor element including an IGBT (Insulated Gate Bipolar Transistor) and a semiconductor element including a MOSFET (Metal Oxide Semiconductor Field Effect Transistor), and may function as a switching device.

In such a semiconductor device, for example, an emitter electrode of the IGBT and a surface electrode of an FWD (Free Wheeling Diode) are connected to each other via solder using a lead terminal. The lead terminal includes: a bonding portion to be bonded to the emitter electrode of the IGBT and the surface electrode of the FWD, respectively; and a wiring section to be connected to the bonding portion via a step portion. Then, the semiconductor elements, such as the IGBT and FWD, and the lead terminal are sealed with a sealing resin (e.g., see Japanese Laid-open Patent Publication No. 2006-202885).

SUMMARY OF THE INVENTION

The inventors of the present application discovered that in such a semiconductor device as described above, once the semiconductor elements, such as the IGBT and FWD, are driven to generate heat, the step portion of the lead terminal will thermally expand. However, because the step portion is sealed with the sealing resin, the thermal expansion is suppressed and its stress will be applied toward the semiconductor element side. Therefore, the surface electrode of the semiconductor element will be damaged, a crack will occur in the surface electrode, and the performance of the semiconductor device will degrade.

According to one aspect, there is provided a semiconductor device including: a semiconductor element; a laminated substrate including an insulating plate and a circuit board which is arranged on a front surface of the insulating plate and on which the semiconductor element is arranged; a lead terminal provided via solder in a major electrode of a front surface of the semiconductor element; and a sealing resin for sealing the semiconductor element, the laminated substrate, and the lead terminal, wherein a value of "Young's modulus of the sealing resin×(linear expansion coefficient of the lead terminal−linear expansion coefficient of the sealing resin)" is equal to or greater than −26×10³ (Pa/° C.) and equal to or less than 50×10³ (Pa/° C.).

The object and advantages of the invention will be realized and attained by means of the elements and combinations particularly pointed out in the claims.

It is to be understood that both the foregoing general description and the following detailed description are provided by way of example and explanatory and are not restrictive of the invention.

DETAILED DESCRIPTION OF THE INVENTION

Hereinafter, the embodiments will be described using the accompanying drawings.

First Embodiment

A semiconductor device of a first embodiment will be described using FIGS. 1A and 1B.

Figure 1A:
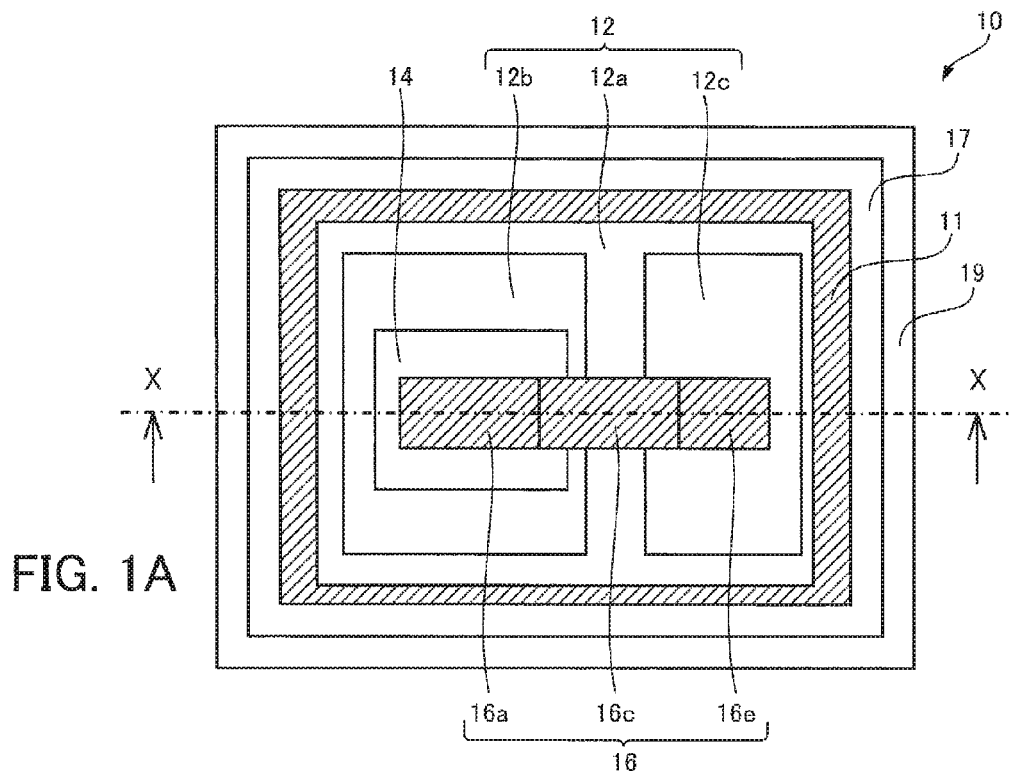
FIGS. 1A and 1B illustrate a semiconductor device in a first embodiment.
Figure 1B:
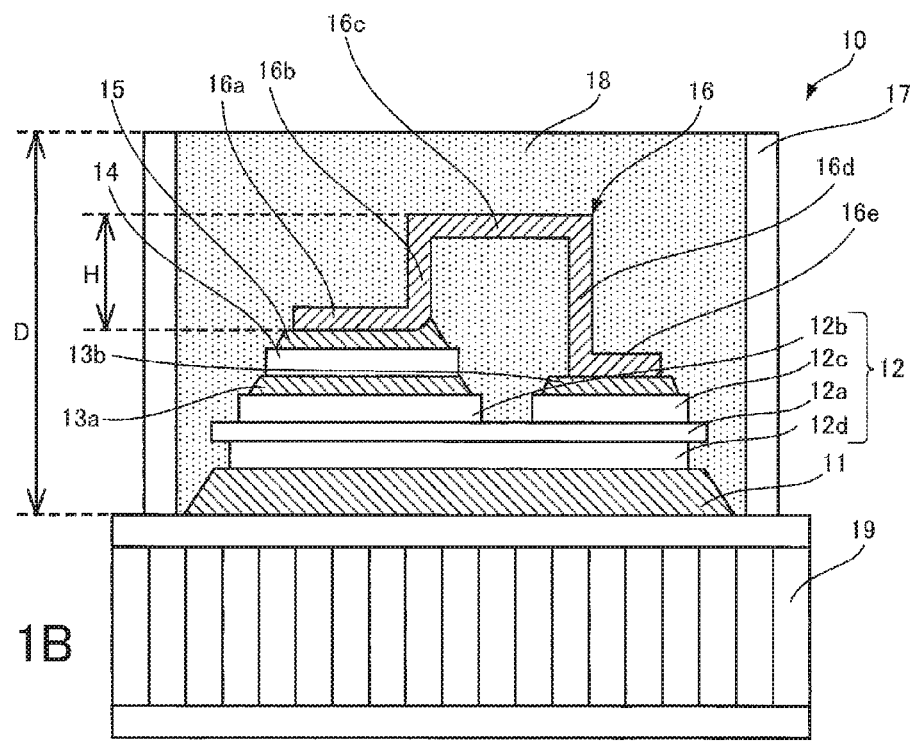

FIGS. 1A and 1B illustrate the semiconductor device in the first embodiment.

Note that, FIG. 1A illustrates the top view of a semiconductor device 10 and FIG. 1B illustrates the cross sectional view in a one-dot chain line X-X in FIG. 1A, respectively. Moreover, in FIG. 1A, the illustration of a sealing resin 18 is omitted.

In the semiconductor device 10, a radiator 19, a laminated substrate 12 provided via solder 11 on the radiator 19, a semiconductor element 14 provided via solder 13a on the laminated substrate 12, and a lead terminal 16 for electrically connecting the semiconductor element 14 and the laminated substrate 12 are provided in a frame-shaped case 17. Moreover, in the semiconductor device 10, the solder 11 inside the case 17, the laminated substrate 12, the semiconductor element 14, and the lead terminal 16 are sealed with a sealing resin 18. The outer shape of the sealing resin 18 is substantially rectangular-parallelepiped, and has the upper surface and the lower surface facing the upper surface and contacting the radiator 19. The upper surface of the radiator 19 and the upper surfaces of the laminated substrate 12, semiconductor element 14, and sealing resin 18 are arranged so as to be substantially parallel to each other.

The solder 11 is for thermally and mechanically connecting the laminated substrate 12 and radiator 19. Such solder 11 is preferably a high-strength solder for the purpose of achieving high reliability. For example, an Sn (tin)-Sb (stibium) based solder or a Sn—Sb—Ag (silver) based solder is used.

The laminated substrate 12 is a DCB (Direct Copper Bonding) substrate, and includes: an insulating plate 12a made of ceramic or the like; circuit boards 12b and 12c that are formed on the front surface of the insulating plate 12a and made of metal or the like; and a metal plate 12d formed on the rear surface of the insulating plate 12a.

The semiconductor element 14 is provided via the solder 13a on the circuit board 12b of the laminated substrate 12. The semiconductor element 14 is, for example, an IGBT, a power MOSFET (Metal Oxide Semiconductor Field Effect Transistor), an FWD, or the like. Moreover, in the semiconductor element 14, an RB (Reverse Blocking)-IGBT, an RC (Reverse Conducting)-IGBT or the like that is vertically formed may be applied within the element. Moreover, on the front surface of such a semiconductor element 14, a surface electrode (illustration is omitted), such as an emitter electrode, a source electrode or an anode electrode, is provided in accordance with the type of the element. The detail of the surface electrode will be described below.

The solder 15 is for electrically and thermally connecting the lead terminal 16 to the surface electrode of the semiconductor element 14. When the 0.2% proof stress of such a solder 15 is high, a high stress will be produced in the surface electrode of the semiconductor element 14. Therefore, for the solder 15, a relatively soft material having a low 0.2% proof stress is preferably used. As such a solder 15, an Sn—Cu (copper) based solder or an Sn—Sb based solder is used, for example. In particular, with the Sn—Sb based solder, it is possible to control the 0.2% proof stress to be lower by setting the additive amount of stibium equal to or greater than approximately 0% and equal to or less than approximately 3%.

The lead terminal 16 includes tabular bonding portions 16a and 16e, tabular step portions 16b and 16d rising vertically upward from the bonding portions 16a and 16e, and a tabular wiring section 16c connecting the step portions 16b and 16d. Such a lead terminal 16 is made of, for example, copper having conductivity. The lead terminal 16 is manufactured by bending a belt-like copper plate. In the lead terminal 16, the bonding portion 16a is bonded to the surface electrode of the semiconductor element 14 via the solder 15. Moreover, in the lead terminal 16, the bonding portion 16e is bonded to the circuit board 12c of the laminated substrate 12 via the solder 13b. Moreover, in the lead terminal 16, a portion where the bonding portion 16a connects to the step portion 16b on the semiconductor element 14 side forms a curved surface, and has the curvature whose curvature radius R is 1 mm, at a corner portion of the bonding portion 16a on the lower side of the step portion 16b. The corner portion of the bonding portion 16a of the lead terminal 16 has such a curvature, so that as illustrated in FIG. 1B, the solder 15 of the lower portion of the corner portion becomes thicker. Therefore, it is possible to suppress a stress on the surface electrode of the semiconductor element 14 directly under the corner portion and suppress the damage to the surface electrode. Such a lead terminal 16 has the thickness equal to or greater than approximately 0.5 mm and equal to or less than approximately 1 mm, for example, and is made of copper, a copper alloy, aluminum, an aluminum alloy, or the like. Note that, in the lead terminal 16, the height from the lower surface of the bonding portion 16a (from the upper surface of the solder 15) to the upper surface of the wiring section 16c is defined as a height H of the lead terminal 16.

Preferably, the sealing resin 18 has a predetermined insulating property and is excellent in moldability. For such a sealing resin 18, an epoxy resin, a maleimide resin, or the like is used, for example. The sealing resin 18 seals the laminated substrate 12, the semiconductor element 14, and the like inside the case 17, as described above. Here, the distance (height) from the lower surface (from the upper surface of the radiator 19) of the sealing resin 18 to the upper surface of the sealing resin 18 is defined as a resin thickness D of the sealing resin 18. In the illustrated example, the upper surface of the wiring section 16c and the upper surface of the sealing resin 18 are substantially parallel to each other.

The radiator 19 is made of, for example, aluminum or the like that is excellent in thermal conductivity, has a cavity provided thereinside, and includes a plurality of fins. The portion between the fins serves as a path for coolant. A liquid medium, for example such as an ethylene glycol solution or water, may be used as such coolant. A gas medium, for example, such as air, other than a liquid medium may be also used as the coolant. Furthermore, a phase-changeable coolant, such as chlorofluocarbon, may be also used which is evaporated by the radiator 19 to cool the semiconductor device.

Note that, in such a semiconductor device 10, not limited to one set of semiconductor element 14 and lead terminal 16, but a plurality of sets of semiconductor elements 14 and lead terminals 16 may be also provided. A plurality of semiconductor elements 14 is arranged in parallel, so that a rated power output of the semiconductor device 10 may be increased. Moreover, in arranging a plurality of semiconductor elements 14, different types of semiconductor elements 14 may be provided, as needed.

Then, bonding of the lead terminal 16 to the surface electrode of the semiconductor element 14 of the semiconductor device 10 will be described using FIG. 2.

Figure 2:
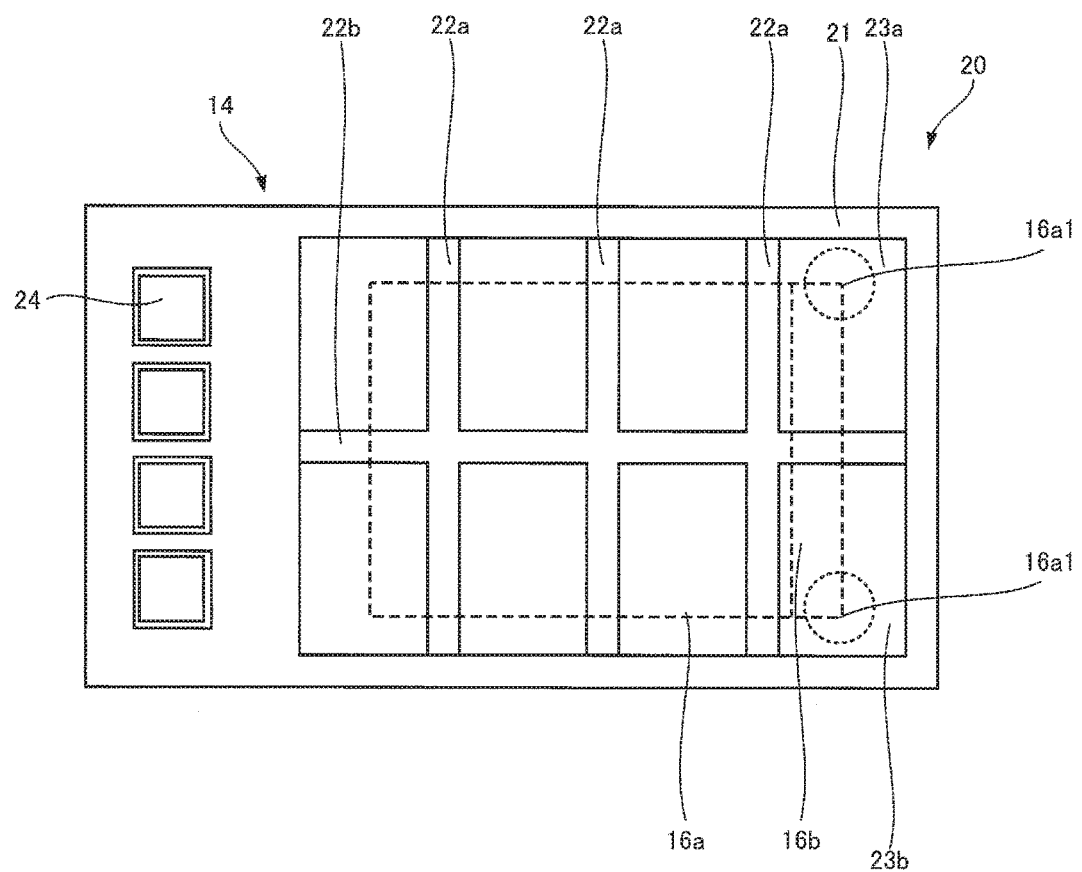
FIG. 2 illustrates a major electrode of a semiconductor element included in the semiconductor device in the first embodiment.

FIG. 2 illustrates a major electrode of the semiconductor element included in the semiconductor device in the first embodiment.

Note that, in FIG. 2, the arrangement position of the bonding portion 16a of the lead terminal 16 is indicated by a dashed line.

A surface electrode 20 of the semiconductor element 14 includes: electrodes 23a and 23b; gate runners 22a and 22b provided on the surface of the electrodes 23a and 23b and electrically connected to a pad electrode 24; and a guard ring 21 provided so as to surround the peripheral thereof.

The lead terminal 16 includes a corner portion (apex) 16a1 (the area surrounded by a broken line circle in the view) at both ends on the semiconductor element 14 side of the portion where the bonding portion 16a and the step portion 16b connect to each other. The bonding portion 16a of the lead terminal 16 is arranged with respect to the surface electrode 20 so that the corner portion 16a1 on the side where the step portion 16b of the bonding portion 16a is formed is located not on the gate runner 22a but on the electrodes 23a and 23b.

If the lead terminal 16 is arranged with respect to the surface electrode 20 so that the corner portion 16a1 on the side where the step portion 16b of the bonding portion 16a is formed is located on the gate runner 22a, then in the bonding portion 16a, a stress from the step portion 16b will be applied to the corner portion 16a1 and might damage the gate runner 22a under the corner portion 16a1. Therefore, the bonding portion 16a of the lead terminal 16 is arranged with respect to the surface electrode 20 so that the corner portion 16a1 of the bonding portion 16a is located on the electrodes 23a and 23b.

In the semiconductor device 10 having such a structure, the lead terminal 16 (in particular, the step portion 16b) will expand due to the heat generation in driving the semiconductor element 14. In this case, because the lead terminal 16 is pressed by being sealed with the sealing resin 18, the step portion 16b is substantially perpendicular to the semiconductor element 14 and will not expand toward the top surface side (vertically upward) of the sealing resin 18, but expand vertically downward, so that the surface electrode of the semiconductor element 14 might be damaged.

Then, in such a semiconductor device 10, a thermal stress simulation of a power cycle test is performed in the cases where various Young's moduli and linear expansion coefficients are used in the sealing resin 18 to calculate the plastic strain amplitude of the surface electrode of the semiconductor element 14.

Generally, the plastic strain amplitude follows the Manson-Coffin law of Formula (1) below.

$$\Delta\epsilon_p \times N_f^b = C \qquad (1)$$

where $\Delta\epsilon_p$: plastic-strain amplitude, $N_f$: fatigue life, b, C: constants depending on the material.

Formula (1) reveals that the plastic strain amplitude needs to be reduced in order to prolong the fatigue life.

Accordingly, also in order to prolong the fatigue life of the surface electrode of the semiconductor element 14, the plastic strain amplitude of the surface electrode of the semiconductor element 14 is preferably reduced.

Note that, in the thermal stress simulation, a case is applied where the surface electrode of the semiconductor element is made of an Al—Si (silicon) material and the thickness thereof is 5 μm. Furthermore, nickel plating is applied in the thickness of 4.5 μm on such a surface electrode.

For the solder 15, a material having a low 0.2% proof stress is preferably used, as described above. As such solder 15, Sn-0.7Cu is used to set the thickness of the solder 15 to approximately 150 μm.

The lead terminal 16 has the thickness of 0.5 mm, and is made of copper (specifically, C1020-1/2H whose linear expansion coefficient is $16.7 \times 10^{-6}/°$ C.).

Moreover, in the power cycle test performed in the thermal stress simulation, the temperature of the semiconductor element 14 is increased from 25° C. to 175° C. in one second and then is decreased to 25° C. in 9 seconds, which procedure is defined as one cycle, and the plastic strain amplitude in this case is calculated.

Next, in such a thermal stress simulation, the plastic strain amplitude of the surface electrode of the semiconductor element 14 when the sealing resin 18 having various Young's moduli and linear expansion coefficients are used will be described using FIG. 3.

Figure 3:
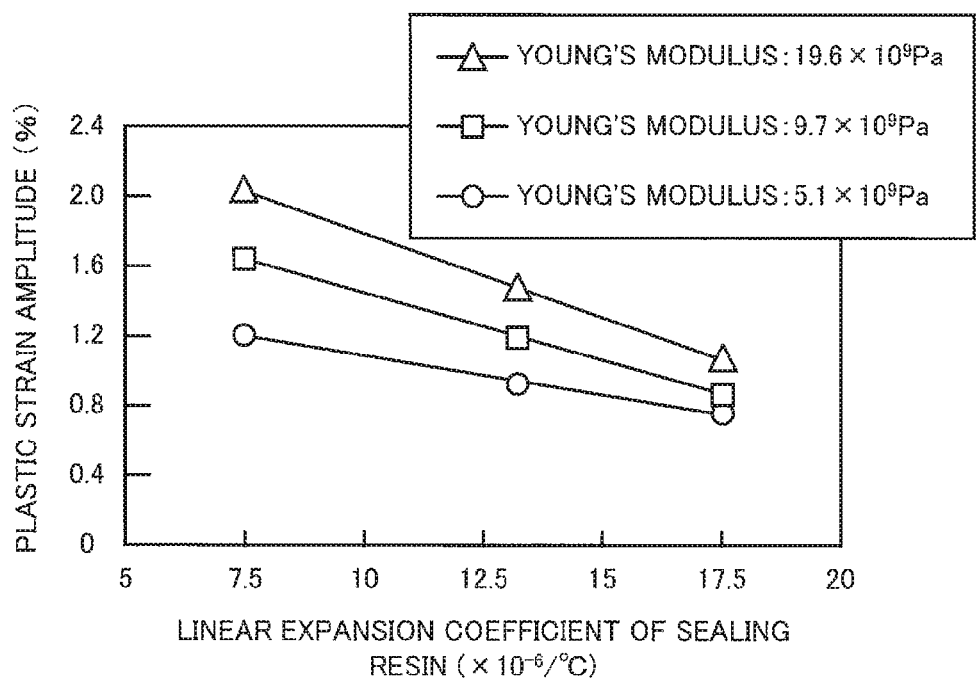
FIG. 3 is a graph illustrating a plastic strain amplitude versus a linear expansion coefficient of a sealing resin in the first embodiment.

FIG. 3 is a graph illustrating the plastic strain amplitude versus the linear expansion coefficient of the sealing resin in the first embodiment.

Note that, the horizontal axis of FIG. 3 represents the linear expansion coefficient ($\times 10^{-6}/°$ C.) of the sealing resin 18 and the vertical axis of FIG. 3 represents the plastic strain amplitude (%) of the surface electrode of the semiconductor element 14, respectively.

Moreover, in the graph of FIG. 3, a circle mark represents a case where the Young's modulus of the sealing resin 18 is $5.1 \times 10^9$ Pa, a square mark represents a case where the Young's modulus of the sealing resin 18 is $9.7 \times 10^9$ Pa, and a triangle mark represents a case where the Young's modulus of the sealing resin 18 is $19.6 \times 10^9$ Pa, respectively.

Note that, the Young's modulus and linear expansion coefficient of the sealing resin 18 when the temperature is 25° C. are applied.

According to the graph of FIG. 3, when Young's modulus is $5.1 \times 10^9$ Pa (circle mark), as the linear expansion coefficient of the sealing resin 18 increases from $7.5 \times 10^{-6}/°$ C. to $13.4 \times 10^{-6}/°$ C. and to $17.6 \times 10^{-6}/°$ C., the plastic strain amplitude decreases from 1.2% to 0.97% and to 0.76%.

Moreover, when Young's modulus is $9.7 \times 10^9$ Pa (square mark), as the linear expansion coefficient of the sealing resin 18 increases from $7.5 \times 10^{-6}/°$ C. to $13.4 \times 10^{-6}/°$ C. and to $17.6 \times 10^{-6}/°$ C., the plastic strain amplitude decreases from 1.65% to 1.23% and to 0.93%.

Furthermore, when Young's modulus is $19.6 \times 10^9$ Pa (triangle mark), as the linear expansion coefficient of the sealing resin 18 increases from $7.5 \times 10^{-6}/°$ C. to $13.4 \times 10^{-6}/°$ C. and to $17.6 \times 10^{-6}/°$ C., the plastic strain amplitude decreases from 2.09% to 1.45% and to 1.06%.

As described above, the graph of FIG. 3 reveals that the larger the linear expansion coefficient of the sealing resin 18 and also the smaller the Young's modulus of the sealing resin 18, the plastic strain amplitude trends to decrease.

That is, it may be contemplated that in the sealing resin 18 having a larger linear expansion coefficient and a smaller Young's modulus, the sealing resin 18 for sealing and pressing the lead terminal 16 expands along with the lead terminal 16 (step portion 16b) which will thermally expand. That is, it may be contemplated that the linear expansion coefficient of the sealing resin 18 approximates to the linear expansion coefficient of the lead terminal 16, so that the lead terminal 16 (step portion 16b) will thermally expand along with the sealing resin 18. Furthermore, it may be contemplated that since the Young's modulus of the sealing resin 18 is smaller, the sealing resin 18 has a smaller pressing force to the lead terminal 16 (step portion 16b) which will thermally expand. Therefore, the sealing resin 18 having a larger linear expansion coefficient and a smaller Young's modulus is selected, so that the prevention of a change in vertically upward expansion of the lead terminal 16 (step portion 16b) which will thermally expand is suppressed. Thus, damages to the surface electrode of the semiconductor element 14 due to the lead terminal 16 (step portion 16b) are reduced, so that the plastic strain amplitude of the surface electrode of the semiconductor element 14 will be reduced.

In consideration of the above-described points, it may be contemplated that the plastic strain amplitude of the surface electrode of the semiconductor element 14 relates to an indicator below.

Indicator (A)=(Young's modulus of the sealing resin 18)×{(linear expansion coefficient of the lead terminal 16)−(linear expansion coefficient of the sealing resin 18)}

Then, a case where the plastic strain amplitude of the surface electrode of the semiconductor element 14 varies with the above-described indicator (A) will be described using FIG. 4.

Figure 4:
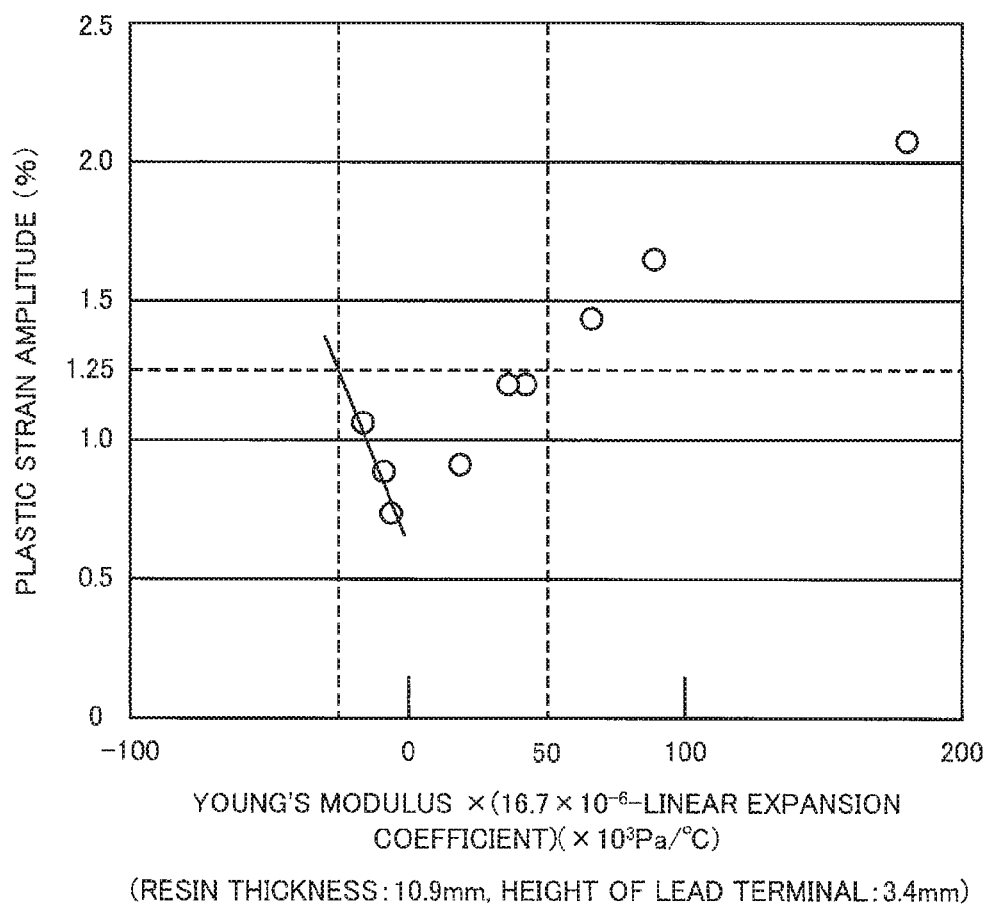
FIG. 4 is a graph illustrating the plastic strain amplitude versus an indicator related to the Young's modulus and linear expansion coefficient in the first embodiment.

FIG. 4 is a graph illustrating the plastic strain amplitude versus the indicator related to the Young's modulus and linear expansion coefficient in the first embodiment.

Note that, the horizontal axis of FIG. 4 represents "Young's modulus of the sealing resin 18×{linear expansion coefficient ($16.7 \times 10^{-6}$) of the lead terminal 16–linear expansion coefficient of the sealing resin 18}×($10^3$ Pa/° C.)", while the vertical axis of FIG. 4 represents the plastic strain amplitude (%) of the surface electrode of the semiconductor element 14.

Moreover, the linear expansion coefficient (circle mark, square mark, or triangle mark) of each sealing resin 18 in the case of each Young's modulus of FIG. 3 was input to the "Young's modulus of the sealing resin 18×{linear expansion coefficient ($16.7 \times 10^{-6}$) of the lead terminal 16–linear expansion coefficient of the sealing resin 18}", respectively.

Furthermore, in FIG. 4, assume a case where the resin thickness D of the sealing resin 18 is 10.9 mm and the height H of the lead terminal 16 is 3.4 mm.

The graph of FIG. 4 reveals that as the "Young's modulus of the sealing resin 18×{($16.7 \times 10^{-6}$)–linear expansion coefficient of the sealing resin 18}" increases from approximately 0, the plastic strain amplitude also increases. On the other hand, the graph of this FIG. 4 reveals that as the "Young's modulus of the sealing resin 18×{($16.7 \times 10^{-6}$)–linear expansion coefficient of the sealing resin 18}" decreases from approximately 0, the plastic strain amplitude increases.

Moreover, comparison of the above-described simulation results with experimental results reveals that in the surface electrode of the semiconductor element 14, the plastic strain amplitude of the surface electrode after the fatigue life of about 50,000 cycles is approximately 1.25%. Therefore, the plastic strain amplitude of the surface electrode of the semiconductor element 14 is preferably equal to or less than 1.25%.

In the graph of FIG. 4, under the condition that the plastic strain amplitude is equal to or less than 1.25%, the maximum value of the "Young's modulus of the sealing resin 18×{($16.7 \times 10^{-6}$)–linear expansion coefficient of the sealing resin 18}" is $46.8 \times 10^3$. Note that, in this case, the Young's modulus of the sealing resin 18 is $5.1 \times 10^9$ Pa and linear expansion coefficient of the sealing resin 18 is $7.5 \times 10^{-6}$/° C.

Similarly, the minimum value of the "Young's modulus of the sealing resin 18×{($16.7 \times 10^{-6}$)–linear expansion coefficient of the sealing resin 18}" is $-17.6 \times 10^3$. Furthermore, judging from the extrapolation line (approximation straight lines) of three points at which the "Young's modulus of the sealing resin 18×{($16.7 \times 10^{-6}$)–linear expansion coefficient of the sealing resin 18}" is minus, the "Young's modulus of the sealing resin 18×{($16.7 \times 10^{-6}$)–linear expansion coefficient of the sealing resin 18}" needs to be equal to or greater than $-26 \times 10^3$ (Pa/° C.) in order for the plastic strain amplitude to become equal to or less than 1.25%.

Accordingly, in order to reduce the plastic strain amplitude of the surface electrode of the semiconductor element (to equal to or less than 1.25%), the "Young's modulus of the sealing resin 18×{($16.7 \times 10^{-6}$)–linear expansion coefficient of the sealing resin 18}" needs to be equal to or greater than at least $-26 \times 10^3$ (Pa/° C.) and equal to or less than $50 \times 10^3$ (Pa/° C.).

In order to satisfy such conditions, the Young's modulus of the sealing resin 18 is selected from a range from $5.1 \times 10^9$ Pa to $19.6 \times 10^9$ Pa and the linear expansion coefficient of the sealing resin 18 is selected from a range from $7.5 \times 10^{-6}$/° C. to $17.6 \times 10^{-6}$/° C. Note that, the Young's modulus of the sealing resin 18 increases in proportion to the additive amount of filler made of silica or the like that is added into the sealing resin 18. Therefore, when the Young's modulus of the sealing resin 18 is desired to be reduced, the additive amount of filler into the sealing resin 18 is preferably reduced.

The above-described semiconductor device 10 includes: the semiconductor element 14; the laminated substrate 12 including the insulating plate 12a and the circuit board 12b which is arranged on the front surface of the insulating plate 12a and on which the semiconductor element 14 is arranged; the lead terminal 16 provided on the major electrode of the front surface of the semiconductor element 14 via the solder 15; and the sealing resin 18 for sealing the semiconductor element 14, laminated substrate 12, and lead terminal 16. Here, the value of the "Young's modulus of the sealing resin 18×(linear expansion coefficient of the lead terminal 16–linear expansion coefficient of the sealing resin 18)" is equal to or greater than $-26 \times 10^3$ (Pa/° C.) and equal to or less than $50 \times 10^3$ (Pa/° C.).

In such a semiconductor device 10, the Young's modulus and linear expansion coefficient of the sealing resin 18 are selected so that the value of the "Young's modulus of the sealing resin 18×(linear expansion coefficient of the lead terminal 16–linear expansion coefficient of the sealing resin 18)" becomes equal to or greater than $-26 \times 10^3$ (Pa/° C.) and equal to or less than $50 \times 10^3$ (Pa/° C.). Accordingly, the prevention of a change in vertically upward expansion of the lead terminal 16 which will thermally expand is suppressed. Thus, damages to the surface electrode of the semiconductor element 14 due to the lead terminal 16 are reduced, so that the plastic strain amplitude of the surface electrode of the semiconductor element 14 will be reduced. As the result, a decrease in performances of the semiconductor device 10 will be suppressed.

Second Embodiment

In a second embodiment, a case will be described where the resin thickness D of the sealing resin 18 is taken into consideration with respect to the result of the graph of FIG. 4 of the first embodiment.

First, the plastic strain amplitude versus the resin thickness D of the sealing resin 18 will be described using FIG. 5.

Figure 5:
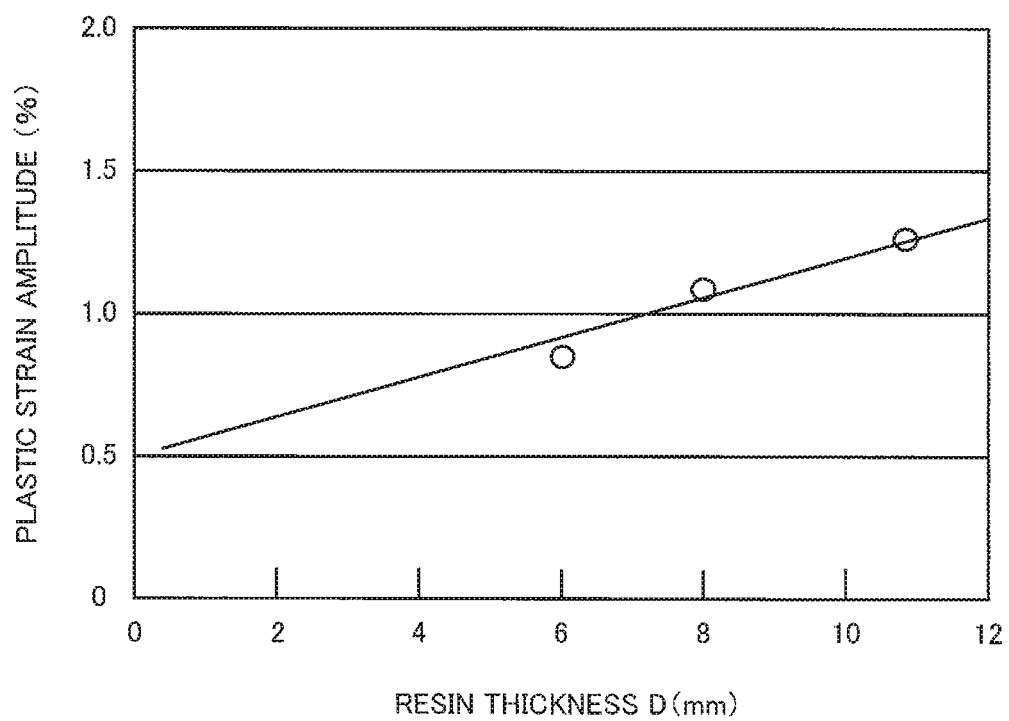
FIG. 5 is a graph illustrating the plastic strain amplitude versus the resin thickness of a sealing resin in a second embodiment.

FIG. 5 is a graph illustrating the plastic strain amplitude versus the resin thickness of the sealing resin in the second embodiment.

Note that, the horizontal axis of FIG. 5 represents the resin thickness D (mm) of the sealing resin 18 while the vertical axis of FIG. 5 represents the plastic strain amplitude (%) of the surface electrode of the semiconductor element 14.

Moreover, in FIG. 5, there is illustrated a case where the "Young's modulus of the sealing resin 18×{($16.7 \times 10^{-6}$)–linear expansion coefficient of the sealing resin 18}" is $31.9 \times 10^3$ (Pa/° C.) and the height H of the lead terminal 16 is 3.4 mm.

The graph of FIG. 5 reveals that as the resin thickness D of the sealing resin 18 increases, the plastic strain amplitude of the semiconductor element 14 will increase. It may be contemplated that as the resin thickness D of the sealing resin 18 increases, the volume of the sealing resin 18 above the lead terminal 16 will increase, so that a pressing force from the sealing resin 18 to the lead terminal 16 will also increase. It may be contemplated that if the pressing force from the sealing resin 18 to the lead terminal 16 increases, the pressing force from the lead terminal 16 to the surface electrode of the semiconductor element 14 will also increase and damage the surface electrode. Thus, it may be contemplated that as the resin thickness D of the sealing resin 18 increases, the plastic strain amplitude of the semiconductor element 14 will increase.

Then, in consideration of also the resin thickness D of the sealing resin 18 with respect to the above-described indicator (A), it may be contemplated that the plastic strain amplitude of the surface electrode of the semiconductor element 14 relates to an indicator (B) below.

Indicator (B)=(Young's modulus of the sealing resin 18)×{(linear expansion coefficient of the lead terminal 16)−(linear expansion coefficient of the sealing resin 18)}×(resin thickness D of the sealing resin 18)

Next, a case where the plastic strain amplitude of the surface electrode of the semiconductor element 14 varies with the above-described indicator (B) will be described using FIG. 6.

Figure 6:
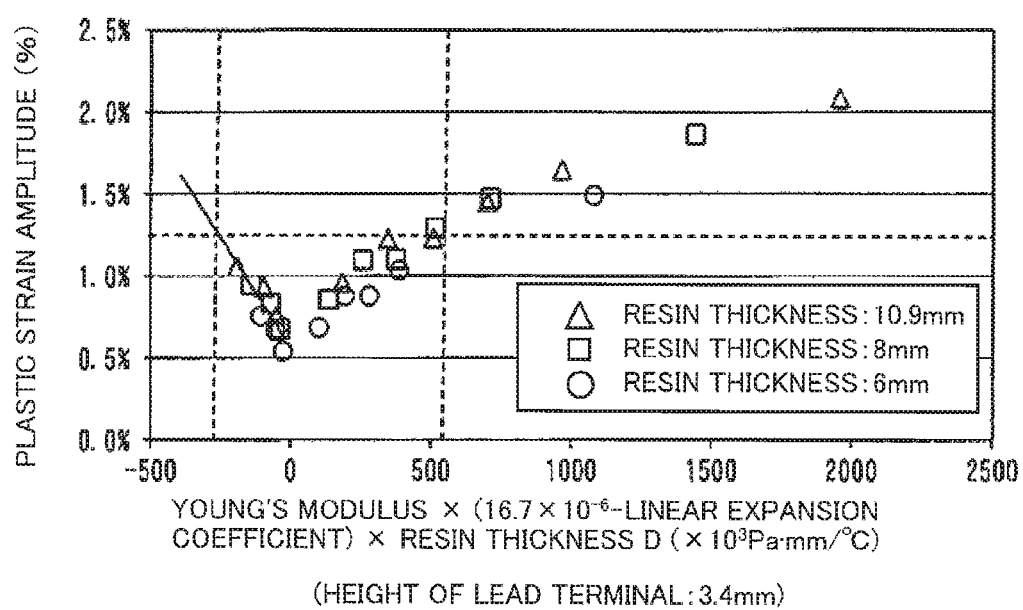
FIG. 6 is a graph illustrating the plastic strain amplitude versus an indicator related to the Young's modulus, linear expansion coefficient and resin thickness in the second embodiment.

FIG. 6 is a graph illustrating the plastic strain amplitude versus the indicator related to the Young's modulus, linear expansion coefficient and resin thickness in the second embodiment.

Note that, the horizontal axis of FIG. 6 represents the "Young's modulus of the sealing resin 18×{linear expansion coefficient of the lead terminal 16 (16.7×10$^{-6}$)−linear expansion coefficient of the sealing resin 18}×(resin thickness of the sealing resin 18)×(10$^3$ Pa·mm/° C.)", while the vertical axis of FIG. 6 represents the plastic strain amplitude (%) of the surface electrode of the semiconductor element 14.

Moreover, the graph of FIG. 6 is obtained by multiplying the value of each point of the graph illustrated in FIG. 4 by the resin thicknesses (6 mm (circle mark), 8 mm (square mark), and 10.9 mm (triangle mark) of the sealing resin 18 illustrated in FIG. 5, respectively.

Furthermore, in FIG. 6, there is illustrated a case where the height H of the lead terminal 16 is 3.4 mm.

The graph of FIG. 6 reveals that as the "Young's modulus of the sealing resin 18×{(16.7×10$^{-6}$)−linear expansion coefficient of the sealing resin 18}×(resin thickness of the sealing resin 18)" increases from approximately 0, the plastic strain amplitude also increases. On the other hand, the graph of FIG. 6 also reveals that as the "Young's modulus of the sealing resin 18×{(16.7×10$^{-6}$)−linear expansion coefficient of the sealing resin 18}×(resin thickness of the sealing resin 18)" decreases from approximately 0, the plastic strain amplitude increases.

Moreover, as with the case of the graph of FIG. 4, under the condition that the plastic strain amplitude is equal to or less than 1.25%, the minimum value of the "Young's modulus of the sealing resin 18×{(16.7×10$^{-6}$)−linear expansion coefficient of the sealing resin 18}×(resin thickness D of the sealing resin 18)" is −191.6×10$^3$, and the maximum value thereof is 509.2×10$^3$. Note that, in the case of the minimum value, the Young's modulus of the sealing resin 18 is 19.6×10$^9$ Pa, the linear expansion coefficient of the sealing resin 18 is 17.6×10$^{-6}$/° C., and the resin thickness D of the sealing resin 18 is 10.9 mm. In the case of the maximum value, the Young's modulus of the sealing resin 18 is 5.1×10$^9$ Pa, the linear expansion coefficient of the sealing resin 18 is 7.5×10$^{-6}$/° C., and the resin thickness D of the sealing resin 18 is 10.9 mm. Furthermore, judging from the extrapolation line of nine points where the "Young's modulus of the sealing resin 18×{(16.7×10$^{-6}$)−linear expansion coefficient of the sealing resin 18}×(resin thickness D of the sealing resin 18)" is minus, in order to set the plastic strain amplitude to be equal to or less than 1.25%, the "Young's modulus of the sealing resin 18×{(16.7×10$^{-6}$)−linear expansion coefficient of the sealing resin 18}×(resin thickness D of the sealing resin 18)" needs to be equal to or greater than −255×10$^3$ (Pa·mm/° C.).

Accordingly, in order to reduce the plastic strain amplitude of the surface electrode of the semiconductor element (to equal to or less than 1.25%), the "Young's modulus of the sealing resin 18×{(16.7×10$^{-6}$)−linear expansion coefficient of the sealing resin 18}×(resin thickness of the sealing resin 18)" needs to be equal to or greater than at least −255×10$^3$ (Pa·mm/° C.) and equal to or less than 515×10$^3$ (Pa·mm/° C.).

In order to satisfy such conditions, the Young's modulus of the sealing resin 18 is selected from a range of 5.1×10$^9$ Pa or more and 19.6×10$^9$ Pa or less, the linear expansion coefficient of the sealing resin 18 is selected from a range of 7.5×10$^{-6}$/° C. or more and 17.6×10$^{-6}$/° C. or less and the resin thickness of the sealing resin 18 is selected from a range of 6 mm or more and 11 mm or less.

The above-described semiconductor device 10 includes: the semiconductor element 14; the laminated substrate 12 including the insulating plate 12a and the circuit board 12b which is arranged on the front surface of the insulating plate 12a and on which the semiconductor element 14 is arranged; the lead terminal 16 provided on the major electrode of the front surface of the semiconductor element 14 via the solder 15; and the sealing resin 18 for sealing the semiconductor element 14, laminated substrate 12, and lead terminal 16. Here, the value of the "Young's modulus of the sealing resin 18×(linear expansion coefficient of the lead terminal 16−linear expansion coefficient of the sealing resin 18)×resin thickness D of the sealing resin 18" is equal to or greater than −255×10$^3$ (Pa·mm/° C.) and equal to or less than 515×10$^3$.

In such a semiconductor device 10, the Young's modulus and linear expansion coefficient of the sealing resin 18 and the resin thickness D of the sealing resin 18 are selected so that the value of the "Young's modulus of the sealing resin 18×(linear expansion coefficient of the lead terminal 16−linear expansion coefficient of the sealing resin 18)×resin thickness of the sealing resin 18" becomes equal to or greater than −255×10$^3$ (Pa·mm/° C.) and equal to or less than 515×10$^3$. Accordingly, the prevention of a change in vertically upward expansion of the lead terminal 16 which will thermally expand is suppressed. Thus, damages to the surface electrode of the semiconductor element 14 due to the lead terminal 16 are reduced, so that the plastic strain amplitude of the surface electrode of the semiconductor element 14 will be reduced. As the result, a decrease in performances of the semiconductor device 10 will be suppressed.

Third Embodiment

In a third embodiment, a case will be described where the height H of the lead terminal 16 is taken into consideration with respect to the result of the graph of FIG. 4 of the first embodiment.

First, the plastic strain amplitude versus the height H of the lead terminal 16 will be described using FIG. 7.

Figure 7:
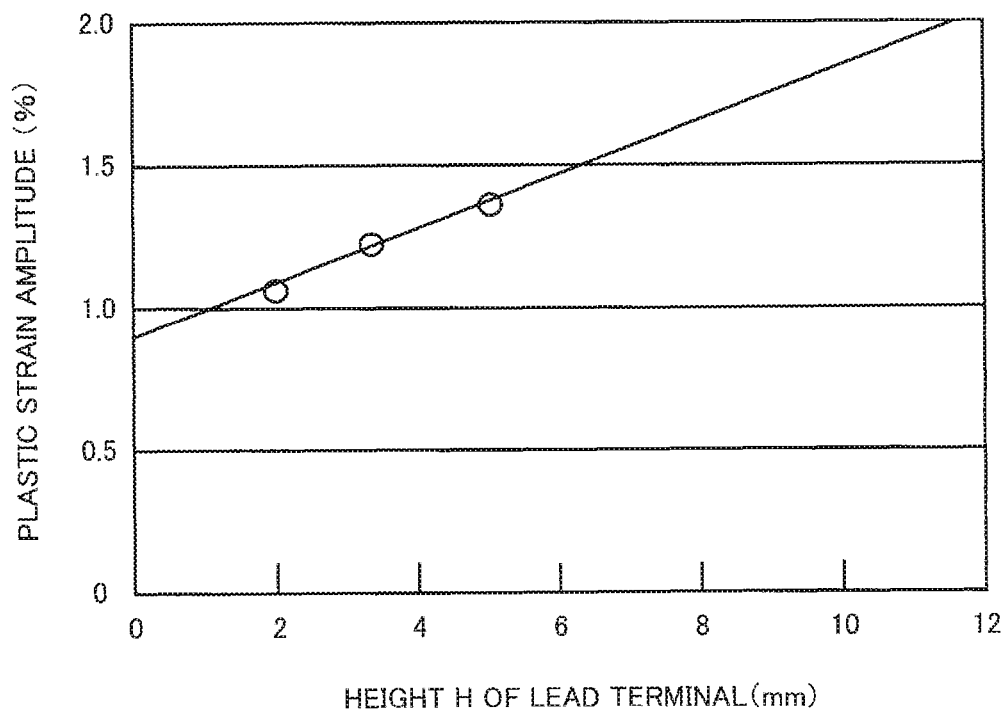
FIG. 7 is a graph illustrating the plastic strain amplitude versus the height of a lead terminal in a third embodiment.

FIG. 7 is a graph illustrating the plastic strain amplitude versus the height of the lead terminal in the third embodiment.

Note that, the horizontal axis of FIG. 7 represents the height H (mm) of the lead terminal 16 while the vertical axis of FIG. 7 represents the plastic strain amplitude (%) of the surface electrode of the semiconductor element 14.

Moreover, in FIG. 7, there is illustrated a case where the "Young's modulus of the sealing resin $18 \times \{(16.7 \times 10^{-6})$–linear expansion coefficient of the sealing resin $18\}$" is $31.9 \times 10^3$ (Pa/° C.) and the resin thickness D of the sealing resin 18 is 10.9 mm.

The graph of FIG. 7 reveals that as the height H of the lead terminal 16 increases, the plastic strain amplitude of the semiconductor element 14 increases. It may be contemplated that because the thermal expansion of the lead terminal 16 increases as the height H of the lead terminal 16 increases, the pressing force applied to the surface electrode of the semiconductor element 14 will increase and damage the surface electrode. Thus, it may be contemplated that as the height H of the lead terminal 16 increases, the plastic strain amplitude of the semiconductor element 14 increases.

Then, in consideration of the height H of the lead terminal 16 with respect to the above-described indicator (A), it may be contemplated that the plastic strain amplitude of the surface electrode of the semiconductor element 14 relates to an indicator (C) below.

Indicator(C)=(Young's modulus of the sealing resin 18)×{(linear expansion coefficient of the lead terminal 16)–(linear expansion coefficient of the sealing resin 18)}×(height $H$ of the lead terminal 16)

Next, a case where the plastic strain amplitude of the surface electrode of the semiconductor element 14 varies with the above-described indicator (C) will be described using FIG. 8.

Figure 8:
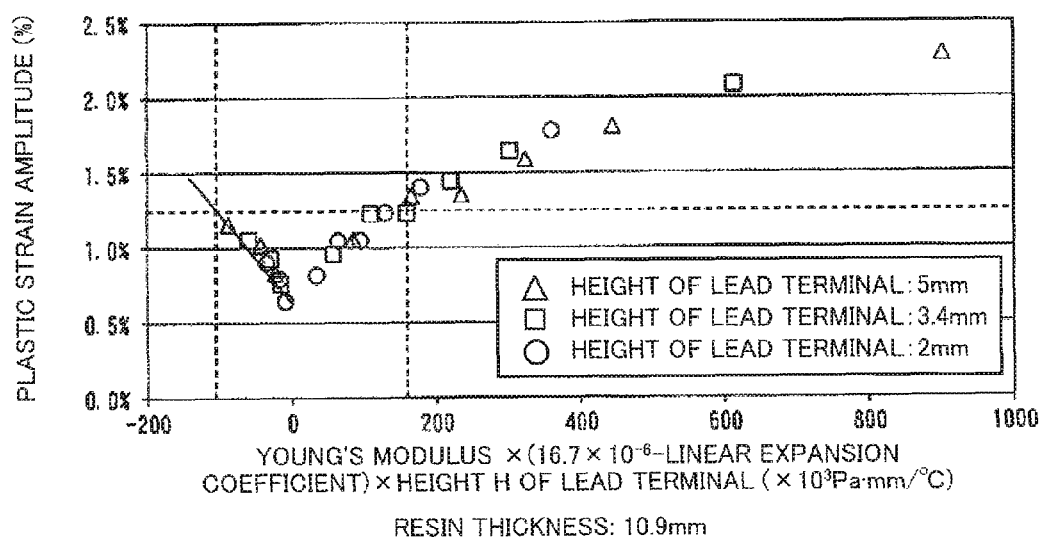
FIG. 8 is a graph illustrating the plastic strain amplitude versus an indicator related to the Young's modulus, linear expansion coefficient and the height of a lead terminal in the third embodiment.

FIG. 8 is a graph illustrating the plastic strain amplitude versus the indicator related to the Young's modulus, linear expansion coefficient and the height of the lead terminal in the third embodiment.

Note that, the horizontal axis of FIG. 8 represents the "Young's modulus of the sealing resin $18 \times \{$linear expansion coefficient of the lead terminal 16 $(16.7 \times 10^{-6})$–linear expansion coefficient of the sealing resin $18\} \times$(height of the lead terminal $16) \times (10^3$ Pa·mm/° C.)" while the vertical axis of FIG. 8 represents the plastic strain amplitude (%) of the surface electrode of the semiconductor element 14.

Moreover, the graph of FIG. 8 is obtained by multiplying the value of each point of the graph illustrated in FIG. 4 by the heights of the lead terminal 16 (2 mm (circle mark), 3.4 mm (square mark), and 5 mm (triangle mark) illustrated in FIG. 7, respectively.

Furthermore, in FIG. 8, the resin thickness D of the sealing resin 18 is 10.9 mm.

The graph of FIG. 8 reveals that as the "Young's modulus of the sealing resin $18 \times \{(16.7 \times 10^{-6})$–linear expansion coefficient of the sealing resin $18\} \times$(resin thickness of the sealing resin $18) \times$(height H of the lead terminal 16)" increases from approximately 0, the plastic strain amplitude also increases. On the other hand, the graph of FIG. 8 also reveals that as the "Young's modulus of the sealing resin $18 \times \{(16.7 \times 10^{-6})$–linear expansion coefficient of the sealing resin $18\} \times$(height H of the lead terminal 16)" decreases from approximately 0, the plastic strain amplitude increases.

Moreover, as with the case of the graph of FIG. 4, under the condition that the plastic strain amplitude is equal to or less than 1.25%, the minimum value of the "Young's modulus of the sealing resin $18 \times \{(16.7 \times 10^{-6})$–linear expansion coefficient of the sealing resin $18\} \times$(height of the lead terminal 16)" is $-88.2 \times 10^3$ and the maximum value thereof is $159.4 \times 10^3$. Note that, in the case of the minimum value, the Young's modulus of the sealing resin 18 is $19.6 \times 10^9$ Pa, the linear expansion coefficient of the sealing resin 18 is $17.6 \times 10^{-6}$/° C., and the height H of the lead terminal 16 is 3.4 mm, while in the case of the maximum value, the Young's modulus of the sealing resin 18 is $5.1 \times 10^9$ Pa, the linear expansion coefficient of the sealing resin 18 is $7.5 \times 10^{-6}$/° C., and the height H of the lead terminal 16 is 3.4 mm.

Furthermore, judging from the extrapolation line of nine points where the "Young's modulus of the sealing resin $18 \times \{(16.7 \times 10^{-6})$–linear expansion coefficient of the sealing resin $18\} \times$(resin thickness of the sealing resin $18) \times$(height H of the lead terminal 16)" is minus, the "Young's modulus of the sealing resin $18 \times \{(16.7 \times 10^{-6})$–linear expansion coefficient of the sealing resin $18\} \times$(resin thickness of the sealing resin $18) \times$(height H of the lead terminal 16)" needs to be equal to or greater than $-93 \times 10^3$ (Pa·mm/° C.) in order to set the plastic strain amplitude to be equal to or less than 1.25%.

Accordingly, in order to reduce the plastic strain amplitude of the surface electrode of the semiconductor element 14 (to equal to or less than 1.25%), the "Young's modulus of the sealing resin $18 \times \{(16.7 \times 10^{-6})$–linear expansion coefficient of the sealing resin $18\} \times$(height H of the lead terminal 16)" needs to be equal to or greater than at least $-93 \times 10^3$ (Pa·mm/° C.) and equal to or less than $159.5 \times 10^3$ (Pa·mm/° C.).

In order to satisfy such conditions, the Young's modulus of the sealing resin 18 is selected from a range of $5.1 \times 10^9$ Pa or more and $19.6 \times 10^9$ Pa or less, the linear expansion coefficient of the sealing resin 18 is selected from a range of $7.5 \times 10^{-6}$/° C. or more and $17.6 \times 10^{-6}$/° C. or less, and the height H of the lead terminal 16 is selected from a range of 2 mm or more and 5 mm or less.

The above-described semiconductor device 10 includes: the semiconductor element 14; the laminated substrate 12 including the insulating plate 12a and the circuit board 12b which is arranged on the front surface of the insulating plate 12a and on which the semiconductor element 14 is arranged; the lead terminal 16 provided on the major electrode of the front surface of the semiconductor element 14 via the solder 15; and the sealing resin 18 for sealing the semiconductor element 14, laminated substrate 12, and lead terminal 16. Here, the value of the "Young's modulus of the sealing resin $18 \times$(linear expansion coefficient of the lead terminal 16–linear expansion coefficient of the sealing resin $18) \times$height H of the lead terminal 16" is equal to or greater than $-93 \times 10^3$ (Pa·mm/° C.) and equal to or less than $159.5 \times 10^3$ (Pa·mm/° C.).

In such a semiconductor device 10, the Young's modulus and linear expansion coefficient of the sealing resin 18 and the height H of the lead terminal 16 are selected so that the value of the "Young's modulus of the sealing resin $18 \times$(linear expansion coefficient of the lead terminal 16–linear expansion coefficient of the sealing resin $18) \times$height H of the lead terminal 16" becomes equal to or greater than $-93 \times 10^3$ (Pa·mm/° C.) and equal to or less than $159.5 \times 10^3$ (Pa·mm/° C.). Accordingly, the prevention of a change in vertically upward expansion of the lead terminal 16 which will thermally expand is suppressed. Thus, damages to the surface electrode of the semiconductor element 14 due to the lead terminal 16 are reduced, so that the plastic strain amplitude of the surface electrode of the semiconductor element 14 will be reduced. As the result, a decrease in performances of the semiconductor device 10 will be suppressed.

Fourth Embodiment

In a fourth embodiment, a specific example will be described where a lead terminal (a jumper terminal in the fourth embodiment) on the surface electrode of the semiconductor element is sealed with a sealing resin that is selected as described in the first to third embodiments.

First, an example of the semiconductor device of the fourth embodiment will be described using FIG. 9.

Figure 9:
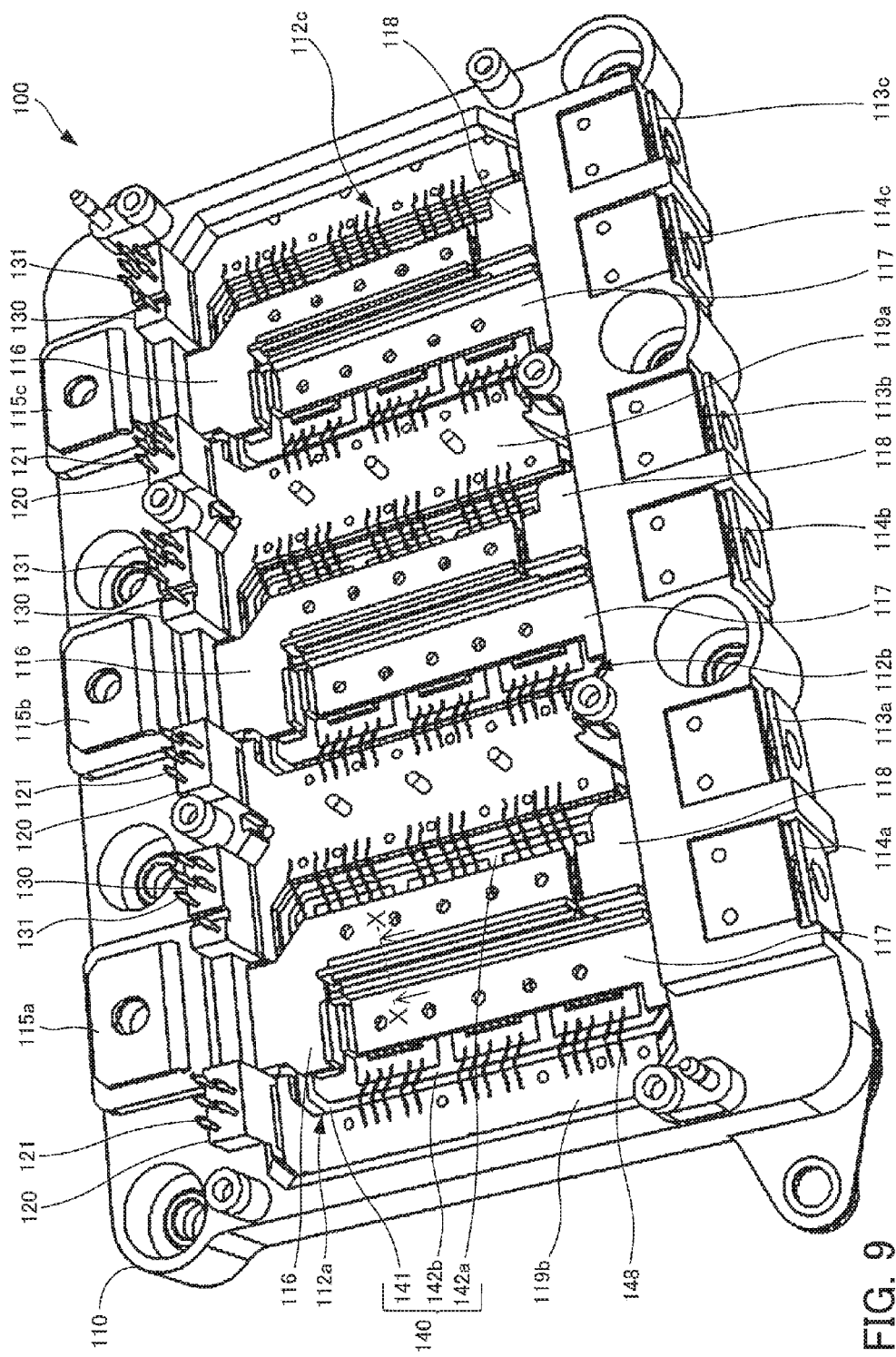
FIG. 9 illustrates a semiconductor device in a fourth embodiment.

FIG. 9 illustrates the semiconductor device in the fourth embodiment.

A semiconductor device 100 includes a case 110 and a laminated substrate 140 that is housed in housing sections 112a, 112b, and 112c of the case 110, respectively.

In the semiconductor device 100, a positive electrode is connected to P terminals 113a, 113b, and 113c, and a negative electrode is connected to N terminals 114a, 114b and 114c, respectively, and a control signal is applied to each of control terminals 121 and 131, so that an output corresponding to the control signal is obtained from a U terminal 115a, a V terminal 115b, and a W terminal 115c, respectively.

Note that, wiring terminals 116, 117, and 118 will be described later.

Furthermore, a laminated substrate 140 will be described using FIG. 10.

Figure 10:
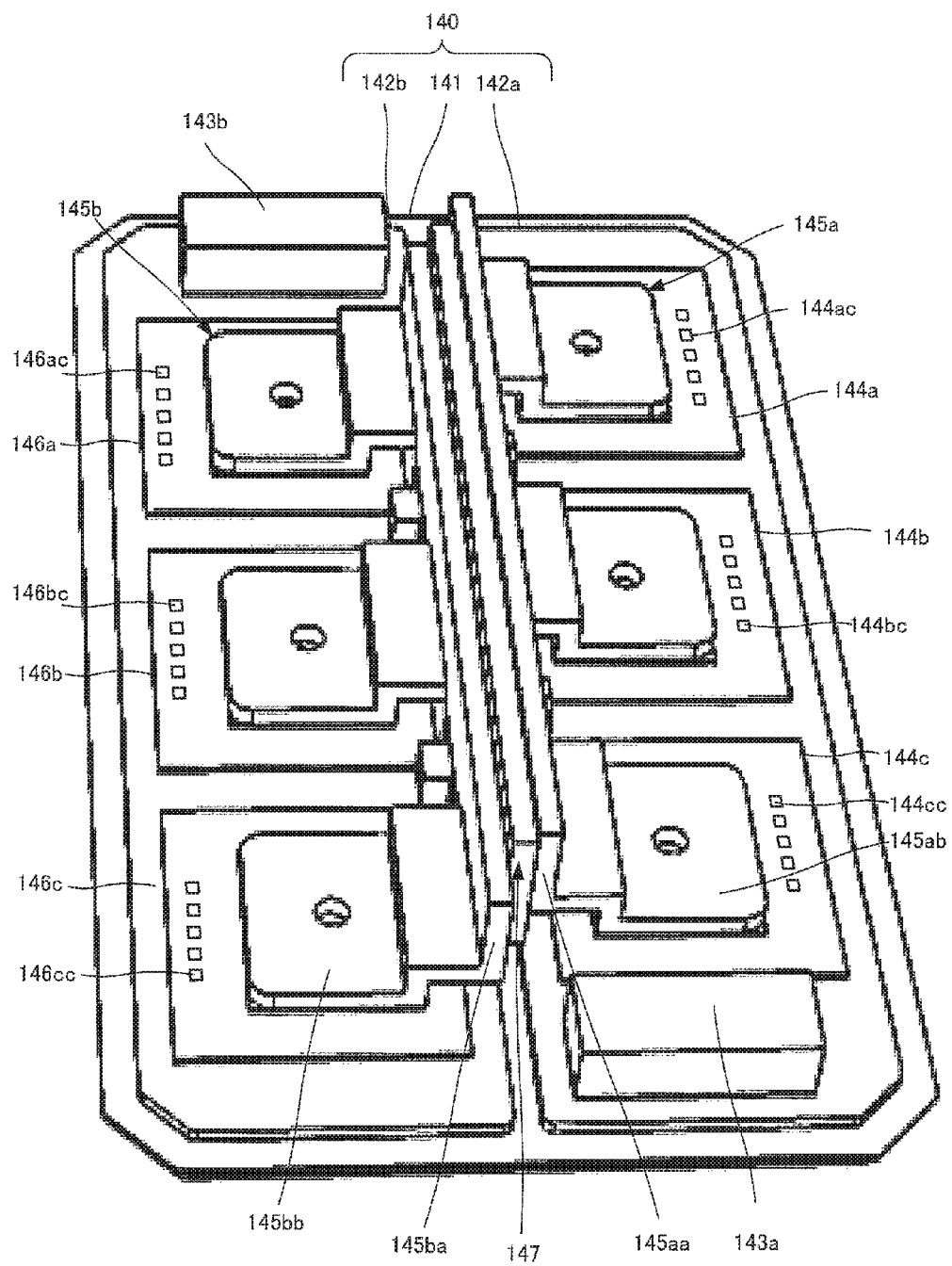
FIG. 10 is a perspective view illustrating a laminated substrate of the semiconductor device in the fourth embodiment.

FIG. 10 is a perspective view illustrating the laminated substrate of the semiconductor device in the fourth embodiment.

A laminated substrate 140 has a heatsink (illustration is omitted) made of copper or the like and arranged in the lower surface of an insulating plate 141 and circuit boards 142a and 142b made of copper foil or the like and arranged in the upper surface of the insulating plate 141, respectively.

On the circuit board 142a, for example a conductive terminal 143a made of copper is arranged on the lower side in the view, and semiconductor elements 144a, 144b, and 144c (collector electrode side thereof) are arranged in a row via solder. Furthermore, a jumper terminal 145a is arranged via solder in each emitter electrode of the semiconductor elements 144a, 144b and 144c arranged in a row, and each emitter electrode of the semiconductor elements 144a, 144b and 144c is electrically connected to each other.

On the circuit board 142b, for example a conductive terminal 143b made of copper is arranged on the upper side in the view, i.e., on the opposite side of the conductive terminal 143a, and semiconductor elements 146a, 146b and 146c (collector electrode side thereof) are arranged in a row via solder. Furthermore, a jumper terminal 145b is arranged via solder in each emitter electrode of the semiconductor elements 146a, 146b, and 146c arranged in a row, and each emitter electrode of the semiconductor elements 146a, 146b, and 146c is electrically connected to each other.

In the illustrated example, the semiconductor elements 144a, 144b, and 144c are electrically connected in parallel, and the semiconductor elements 146a, 146b, and 146c are electrically connected in parallel. The number of these semiconductor elements may vary with the capacity of the semiconductor device.

Moreover, a flat plate section 145aa and a flat plate section 145ba are arranged shifted from each other while sandwiching a resin plate 147.

Furthermore, the cross sectional view in a one-dot chain line X-X of the semiconductor device 100 of FIG. 9 will be described using FIGS. 11 and 12.

Figure 11:
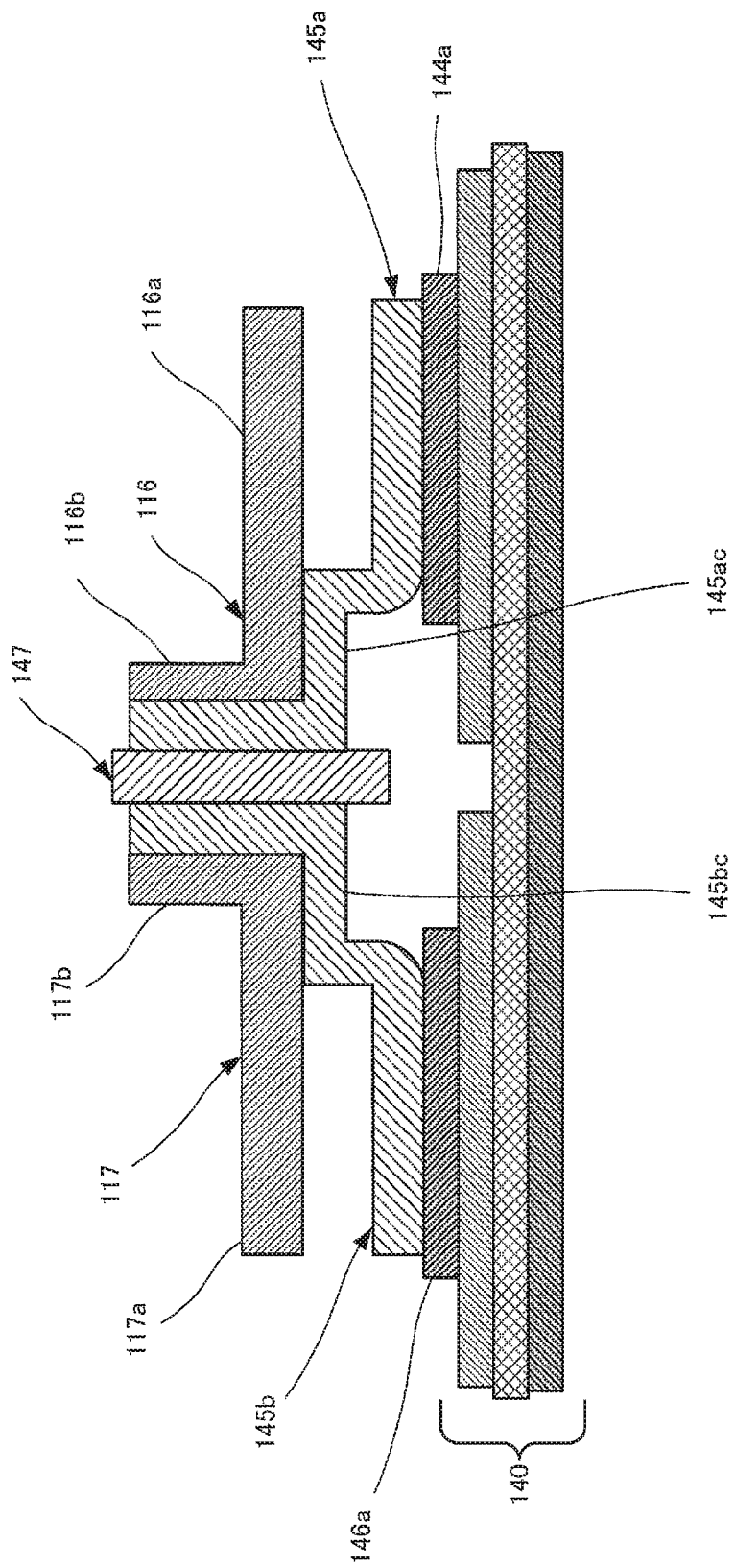
FIG. 11 is a cross sectional view illustrating a wiring terminal and laminated substrate of the semiconductor device in the fourth embodiment.

FIG. 11 is a cross sectional view illustrating the wiring terminal and laminated substrate of the semiconductor device in the fourth embodiment.

Figure 12:
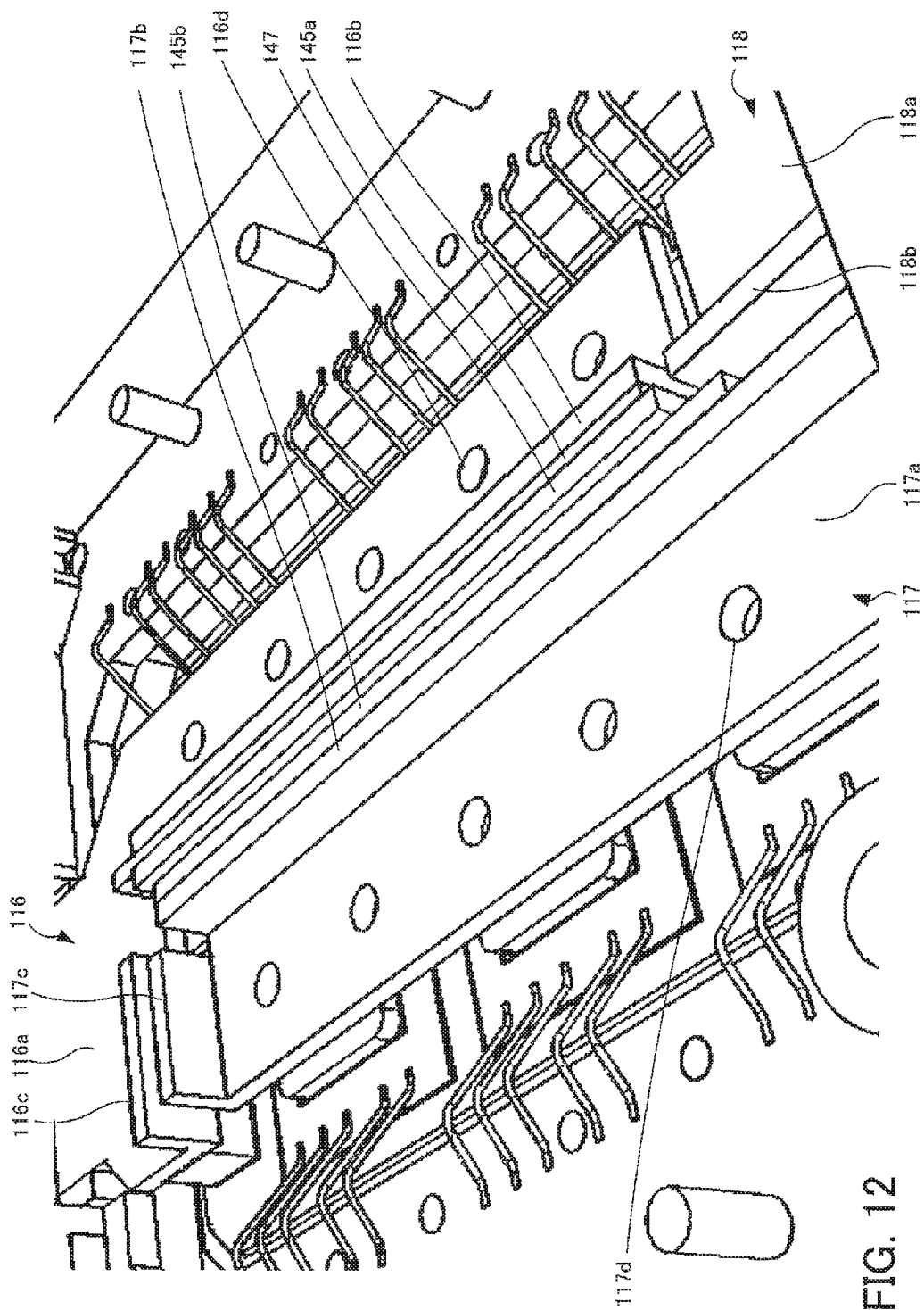
FIG. 12 illustrates an enlarged main portion of the semiconductor device in the fourth embodiment.

FIG. 12 illustrates an enlarged main portion of the semiconductor device in the fourth embodiment.

A wiring terminal 116 includes a bottom face section 116a, a side face section 116b, and a side face section 116c.

The bottom face section 116a is bonded, on the rear face side (lower surface in the view) of one end thereof, to one end of the U terminal 115a, V terminal 115b, and W terminal 115c, and to the conductive terminal 143b, as illustrated in FIGS. 9, 10, and 12, and another end thereof extends to the near side of a wiring terminal 118, in parallel with printed circuit boards 119a and 119b.

The jumper terminal 145a (145b) includes: a bonding section 145ab (145bb); the flat plate section (plate member) 145aa (145ba); and a wiring section 145ac (145bc) for connecting the flat plate section 145aa (145ba) and the bonding section 145ab (145bb). The wiring section 145ac (145bc) includes: a portion substantially parallel to the bonding section 145ab (145bb); and a step portion to be approximately vertically connected to the bonding section 145ab (145bb).

Moreover, the lower side (lower surface in the view) of the bottom face section 116a is supported by the wiring section 145ac of the jumper terminal 145a as illustrated in FIG. 11. Moreover, the bottom face section 116a projects from the wiring section 145ac, and a gap is provided between the projecting portion of the bottom face section 116a and the bonding section 145ab. A through-hole 116d extending from the upper surface in the view as illustrated in FIG. 12 to the lower surface side is formed in the projecting portion of the bottom face section 116a. The through-hole 116d is provided in the projecting portion of the bottom face section 116a in this manner, so that the semiconductor device 100 allows the resin to enter the through-hole 116d when sealed with the resin, the adhesion of the resin to be improved, and the resin to be hardly peeled off.

The side face section 116b is the surface which is provided so as to rise in an L shape from the bottom face section 116a on a side facing the wiring terminal 117 of the bottom face section 116a (so as to be perpendicular to the bottom face section 116a), as illustrated in FIGS. 9, 11, and 12. The side face section 116b is arranged in parallel to a side face section 117b described below, as illustrated in FIGS. 9, 11, and 12, and is bonded to the jumper terminal 145a (flat plate section 145aa thereof) to be electrically connected to the jumper terminal 145a.

For example, the side face section 116b bonds to the flat plate section 145aa on the upper end side (side facing the laminated substrate 140) of the flat plate section 145aa. The side face section 116b is bonded on the upper end side of the flat plate section 145aa in this manner, so that the bonded portion may be kept away from each semiconductor element. Thus, in the semiconductor device 100, the stress transmitted to each semiconductor element and/or laminated substrate 140 due to expansion or the like of the wiring terminal 116 may be weakened and the cracking and/or damaging of each semiconductor element and/or laminated substrate 140 may be suppressed. Accordingly, the reliability of the semiconductor device 100 may be improved.

Moreover, the side face section 116c is the surface which is provided so as to rise in an L shape from the bottom face section 116a on a side facing the wiring terminal 117 of the bottom face section 116a (so as to be perpendicular to the bottom face section 116a), as illustrated in FIGS. 9 and 12, and is arranged in parallel to the side face section 117c of the wiring terminal 117. The thickness of the side face sections 116b and 116c is 1.0 mm to 1.5 mm, for example.

The wring terminal 117 includes a bottom face section 117a, a side face section 117b, and a side face section 117c. The bottom face section 117a is bonded, on the rear face side (lower surface in the view) of one end thereof, to one end of the N terminals 114a, 114b, and 114c, as illustrated in FIGS. 9, 11, and 12, and another end thereof extends to the near side of the wiring terminal 116, in parallel with printed circuit boards 119a and 119b.

Moreover, the lower side (lower surface in the view) of the bottom face section 117a is supported by the wiring section 145bc of the jumper terminal 145b, as illustrated in FIG. 11. Moreover, the bottom face section 117a projects from the wiring section 145ac, and a gap is provided between the projecting portion of the bottom face section 117a and the bonding section 145bb. A through-hole 117d extending from the upper surface in the view as illustrated in FIG. 12 to the lower surface side is formed in the projecting portion of the bottom face section 117a. As described above, the through-hole 117d is provided in the projecting portion of the bottom face section 117a, so that the semiconductor device 100 allows the resin to enter the through-hole 117d when sealed with the resin, the adhesion of the resin to be improved, and the resin to be hardly peeled off.

The side face section 117b is the surface which is provided so as to rise in an L shape from the bottom face section 117a on a side facing the wiring terminal 116 of the bottom face section 117a and the wiring terminal 118 (so as to be perpendicular to the bottom face section 117a), as illustrated in FIGS. 9, 11, and 12. The side face section 117b is arranged in parallel to the side face sections 116b and 118b described below, as illustrated in FIGS. 9, 11, and 12, and is bonded to the jumper terminal 145b (flat plate section 145ba thereof) to be electrically connected to the jumper terminal 145b.

For example, the side face section 117b bonds to the flat plate section 145ba on the upper end side (side facing the laminated substrate 140) of the flat plate section 145ba. The side face section 117b is bonded on the upper end side of the flat plate section 145ba in this manner, so that the bonded portion may be kept away from each semiconductor element. Thus, in the semiconductor device 100, the stress transmitted to each semiconductor element and/or laminated substrate 140 due to expansion or the like of the wiring terminal 117 may be weakened and the cracking and/or damaging of each semiconductor element and/or laminated substrate 140 may be suppressed. Accordingly, the reliability of the semiconductor device 100 may be improved.

Moreover, the side face section 117c is the surface which is provided so as to rise in an L shape from the bottom face section 117a on a side facing the wiring terminal 116 of the bottom face section 117a (so as to be perpendicular to the bottom face section 117a), as illustrated in FIGS. 9 and 12, and is arranged in parallel to the side face section 116c of the wiring terminal 116. The thickness of the side face sections 117b and 117c is 1.0 mm to 1.5 mm, for example.

As described above, the side face section 116b and the side face section 117b are arranged in parallel to each other while sandwiching the flat plate section 145aa, resin plate 147, and flat plate section 145ba arranged in parallel.

That is, in the semiconductor device 100, the side face section 117b and flat plate section 145ba electrically connected to each other and the side face section 116b and flat plate section 145aa electrically connected to each other are arranged in parallel while sandwiching the resin plate 147. Moreover, in the semiconductor device 100, the side face section 116c and the side face section 117c are arranged in parallel. Moreover, in the semiconductor device 100, the side face section 117b and the side face section 118b are arranged in parallel.

In the semiconductor device 100 having such configuration, the laminated substrates 140 housed respectively in the housing sections 112a, 112b, and 112c of the case 110, printed circuit boards 119a and 119b, and wiring terminals 116, 117, and 118, are sealed with sealing resin.

The sealing resin at this time is selected so that for example, as described in the first to third embodiments, the value of the "Young's modulus of the sealing resin×(linear expansion coefficient of the jumper terminal−linear expansion coefficient of the sealing resin)" becomes equal to or greater than $-26 \times 10^3$ (Pa/° C.) and equal to or less than $50 \times 10^3$ (Pa/° C.), the value of the "Young's modulus of the sealing resin×(linear expansion coefficient of the jumper terminal−linear expansion coefficient of the sealing resin)× resin thickness of the sealing resin" becomes equal to or greater than $-255 \times 10^3$ (Pa·mm/° C.) and equal to or less than $515 \times 10^3$ (Pa·mm/° C.), and the value of the "Young's modulus of the sealing resin×(linear expansion coefficient of the jumper terminal−linear expansion coefficient of the sealing resin)×height of the jumper terminal" becomes equal to or greater than $-93 \times 10^3$ (Pa·mm/° C.) and equal to or less than $159.5 \times 10^3$ (Pa·mm/° C.).

Accordingly, the prevention of a change in vertically upward expansion of the jumper terminal which will thermally expand is suppressed. Thus, damages to the surface electrode of the semiconductor element due to the jumper terminal are reduced, so that the plastic strain amplitude of the surface electrode of the semiconductor element will be reduced. As the result, a decrease in performances of the semiconductor device 100 will be suppressed.

According to the disclosed technique, the semiconductor device may suppress the stress from the lead terminal with respect to the major electrode of the semiconductor element, and may suppress a decrease in performances.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a semiconductor element including a major electrode at a front surface of the semiconductor element;
a laminated substrate including
an insulating plate, and
a circuit board which is arranged on a front surface of the insulating plate, and on which the semiconductor element is arranged;
solder;
a lead terminal provided via the solder on the major electrode of the semiconductor element; and
a sealing resin for sealing the semiconductor element, the laminated substrate, and the lead terminal, a value of "a Young's modulus of the sealing resin×(a linear expansion coefficient of the lead terminal−a linear expansion coefficient of the sealing resin)" is equal to or greater than $-26 \times 10^3$ (Pa/° C.) and equal to or less than $50 \times 10^3$ (Pa/° C.).

2. The semiconductor device according to claim 1, wherein a value of "the Young's modulus of the sealing resin×(the linear expansion coefficient of the lead terminal−the linear expansion coefficient of the sealing resin)×a height of the sealing resin" is equal to or greater than −255×10³ (Pa·mm/° C.) and equal to or less than 515×10³ (Pa·mm/° C.).

3. The semiconductor device according to claim 2, wherein the height of the sealing resin is equal to or greater than 6 mm and equal to or less than 11 mm.

4. The semiconductor device according to claim 1, wherein a value of "the Young's modulus of the sealing resin×(the linear expansion coefficient of the lead terminal−the linear expansion coefficient of the sealing resin)×a height of the lead terminal" is equal to or greater than −93×10³ (Pa·mm/° C.) and equal to or less than 159.5×10³ (Pa·mm/° C.).

5. The semiconductor device according to claim 4, wherein a height of the lead terminal along a direction to extend away from the semiconductor element is equal to or greater than 2 mm and equal to or less than 5 mm.

6. The semiconductor device according to claim 1, wherein the Young's modulus of the sealing resin is equal to or greater than 5.1×10⁹ Pa and equal to or less than 19.6×10⁹ Pa, and the linear expansion coefficient of the sealing resin is equal to or greater than 7.5×10⁻⁶/° C. and equal to or less than 17.6×10⁻⁶/° C.

7. The semiconductor device according to claim 1, wherein the lead terminal is made of copper.

8. The semiconductor device according to claim 1, wherein the lead terminal includes a bonding section provided on the major electrode of the semiconductor element, and a step portion that vertically rises from the bonding section.

9. The semiconductor device according to claim 8, wherein a corner portion of the bonding section of the lead terminal on a lower side of the step portion has a curvature.

10. The semiconductor device according to claim 8, wherein
the major electrode of the semiconductor element includes a first area in which gate runners are provided, and a second area in which electrodes are provided, and
the lead terminal includes a corner portion where the bonding section and the step portion connect to each other, the corner portion being located on the second area.

11. A semiconductor device, comprising:
a semiconductor element including a major electrode at a front surface of the semiconductor element;
a laminated substrate including
an insulating plate, and
a circuit board which is arranged on a front surface of the insulating plate, and on which the semiconductor element is arranged;
solder;
a lead terminal provided via the solder on the major electrode of the semiconductor element; and
a sealing resin for sealing the semiconductor element, the laminated substrate, and the lead terminal, the sealing resin having predetermined ranges of a Young's modulus and a linear expansion coefficient so that a value of "a Young's modulus of the sealing resin×(a linear expansion coefficient of the lead terminal−a linear expansion coefficient of the sealing resin)" is in the range of −26×10³ (Pa/° C.) to 50×10³ (Pa/° C.), thereby reducing a plastic strain amplitude of the major electrode.

12. A semiconductor device, according to claim 11, wherein the sealing resin has the Young's modulus in the range of 5.1×10⁹ Pa to 19.6×10⁹ Pa, and the linear expansion coefficient in the range of 7.5×10⁻⁶/° C. to 17.6×10⁻⁶/° C., so that the value of the Young's modulus of the sealing resin×(a linear expansion coefficient of the lead terminal−a linear expansion coefficient of the sealing resin) is in the range of −26×10³ (Pa/° C.) to 50×10³ (Pa/° C.), thereby reducing the plastic strain amplitude of the major electrode to a value equal to or less than 1.25%.

\* \* \* \* \*